US008018369B2

(12) United States Patent
Payne et al.

(10) Patent No.: US 8,018,369 B2

(45) Date of Patent: Sep. 13, 2011

(54) ERROR CORRECTION METHOD AND APPARATUS

(75) Inventors: Robert F. Payne, Lucas, TX (US); Marco Corsi, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/896,603

(22) Filed: Oct. 1, 2010

(65) Prior Publication Data

US 2011/0018750 A1 Jan. 27, 2011

Related U.S. Application Data

(63) Continuation of application No. 12/393,207, filed on Feb. 26, 2009, now Pat. No. 7,825,846.

(51) Int. Cl.
*H03M 1/38* (2006.01)

(52) U.S. Cl. ........................................ 341/161; 341/162

(58) Field of Classification Search .................. 341/161, 341/162, 155, 156, 172, 122, 120, 163
See application file for complete search history.

(56) References Cited

U.S. PATENT DOCUMENTS

| | | | | |
|---|---|---|---|---|
| 3,925,691 | A | 12/1975 | Gaskill, Jr. et al. | |
| 4,345,217 | A | 8/1982 | Pace | |
| 4,855,618 | A | 8/1989 | Brokaw | |
| 5,373,228 | A | 12/1994 | Holle | |
| 5,512,815 | A | 4/1996 | Schrader | |
| 5,530,444 | A * | 6/1996 | Tice et al. | 341/156 |
| 5,973,631 | A * | 10/1999 | McMullen et al. | 341/144 |
| 6,344,769 | B1 | 2/2002 | Giuroiu | |
| 6,525,613 | B2 | 2/2003 | Cyrusian | |
| 6,664,842 | B1 | 12/2003 | Pobanz | |
| 6,933,787 | B1 | 8/2005 | Kobayashi | |
| 7,236,055 | B2 | 6/2007 | Halbert et al. | |
| 7,561,095 | B2 * | 7/2009 | Sasaki et al. | 341/161 |
| 7,839,318 | B2 * | 11/2010 | Wolf et al. | 341/162 |
| 2004/0046684 | A1 * | 3/2004 | Cusinato | 341/161 |
| 2006/0152282 | A1 | 7/2006 | Halbert et al. | |
| 2006/0208782 | A1 * | 9/2006 | Sanduleanu et al. | 327/185 |

* cited by examiner

*Primary Examiner* — Joseph Lauture

(74) *Attorney, Agent, or Firm* — John J. Patti; Wade J. Brady, III; Frederick J. Telecky, Jr.

(57) ABSTRACT

A switched current source is provided. The switched current source is generally comprised of transistors and resistors, and the source has a high output impedance. Included with the switched current source is an error correction transistor and a resistor that cooperate to feed a current back through a bias transistor to correct an error that generally results from the current gains or β's of transistors within the switched current source. To accomplish this, however, the resistor is selected to have a value that is sufficiently large such that current from the error correction transistor flows back through the bias transistor.

11 Claims, 2 Drawing Sheets

ERROR CORRECTION METHOD AND APPARATUS

CROSS-REFERENCE TO RELATED APPLICATIONS

This application is a continuation of U.S. patent application Ser. No. 12/393,207, entitled "Error Correction Method and Apparatus," filed on Feb. 26, 2009, which is hereby incorporated by reference for all purposes.

TECHNICAL FIELD

The invention relates generally to current source and, more particularly, to a switched current source for a digital-to-analog converter (DAC).

BACKGROUND

Current sources are commonplace in DACs. However, these current sources can be plagued with problems stemming from errors that are naturally produced in the current sources. Some examples of conventional arrangements are U.S. Pat. No. 3,925,691; U.S. Pat. No. 4,345,217; U.S. Pat. No. 4,855,618; U.S. Pat. No. 5,373,228; U.S. Pat. No. 5,512,815; U.S. Pat. No. 6,344,769; U.S. Pat. No. 6,525,613; U.S. Pat. No. 6,664,842; U.S. Pat. No. 6,933,787; U.S. Pat. No. 7,236,055; and U.S. Patent Pre-Grant Publ. No. 20060152282.

SUMMARY

A preferred embodiment of the present invention, accordingly, provides an apparatus. The apparatus comprises a current source; a first input transistor having a first passive electrode, a second passive electrode and a control electrode, wherein the first input transistor receives a first input voltage through its control electrode and that is coupled to the current source at its first passive electrode; a second input transistor having a first passive electrode, a second passive electrode and a control electrode, wherein the second transistor receives a second input voltage through its control electrode and that is coupled to the current source at its first passive electrode; a first output transistor that is coupled to the second passive electrode of the first input transistor at its control electrode; a second output transistor that is coupled to second passive electrode of the second input transistor at its control electrode; a bias transistor having a first passive electrode, a second passive electrode, and a control electrode, wherein the first passive electrode of the bias transistor is coupled to the second passive electrode of the first output transistor and the second passive electrode of the second output transistor; an error correction transistor having a first passive electrode, a second passive electrode, and a control electrode, wherein the first passive electrode of the error correction transistor is coupled to the control electrode first output transistor, and wherein the second passive electrode of the error correction transistor is coupled to the second passive electrode of the bias transistor; and a resistor that is coupled between the second passive electrode of the bias electrode and ground, wherein the resistor has a value that is sufficiently large such that current from the error correction transistor flows back through the bias transistor.

In accordance with a preferred embodiment of the present invention, the apparatus further comprises a second resistor that is coupled between the control electrode of the first input transistor and the first passive electrode of the error correction transistor.

In accordance with a preferred embodiment of the present invention, the first passive electrode of the error correction transistor is coupled to the control electrode of the second output transistor.

In accordance with a preferred embodiment of the present invention, the apparatus further comprises a second resistor that is coupled between the first passive electrode of the error correction transistor and the control electrode of the second output transistor.

In accordance with a preferred embodiment of the present invention, the resistor is about 750Ω.

In accordance with a preferred embodiment of the present invention, an apparatus is provided. The apparatus comprises an analog-to-digital converter (ADC) pipeline having a plurality of stages, wherein the ADC pipeline receives an analog input signal and outputs a digital signal across a plurality of channels, and wherein at least one stage includes a digital-to-analog converter (DAC) having a switched current source that includes: a current source; a first input transistor having a first passive electrode, a second passive electrode and a control electrode, wherein the first input transistor receives a first input voltage through its control electrode and that is coupled to the current source at its first passive electrode; a second input transistor having a first passive electrode, a second passive electrode and a control electrode, wherein the second transistor receives a second input voltage through its control electrode and that is coupled to the current source at its first passive electrode; a first output transistor that is coupled to the second passive electrode of the first input transistor at its control electrode; a second output transistor that is coupled to second passive electrode of the second input transistor at its control electrode; a bias transistor having a first passive electrode, a second passive electrode, and a control electrode, wherein the first passive electrode of the bias transistor is coupled to the second passive electrode of the first output transistor and the second passive electrode of the second output transistor; an error correction transistor having a first passive electrode, a second passive electrode, and a control electrode, wherein the first passive electrode of the error correction transistor is coupled to the control electrode first output transistor, and wherein the second passive electrode of the error correction transistor is coupled to the second passive electrode of the bias transistor; and a resistor that is coupled between the second passive electrode of the bias electrode and ground, wherein the resistor has a value that is sufficiently large such that current from the error correction transistor flows back through the bias transistor; and an ADC output driver that is coupled to the ADC pipeline.

In accordance with a preferred embodiment of the present invention, each stage of the ADC pipeline further comprises a sample-and-hold (S/H) amplifier that receives an analog signal; and an ADC that is coupled to the S/H amplifier.

In accordance with a preferred embodiment of the present invention, the apparatus further comprises digital correction circuitry that is coupled to the ADC pipeline.

In accordance with a preferred embodiment of the present invention, a switched current source is provided. The switched current source comprises a current source; a first PNP transistor that receives a first input voltage through its base and that is coupled to the current source at its emitter; a second PNP transistor that receives a second input voltage through its base and that is coupled to the current source at its emitter; a first NPN transistor that is coupled to the collector of the first PNP transistor at its base; a second NPN transistor that is coupled to the collector of the second PNP transistor at its base; a third NPN transistor that is coupled to the emitters of the first and second NPN transistors at its collector; an third PNP transistor that is coupled to the base of the first NPN transistor at its emitter and that is coupled to the emitter of the third NPN transistor at its collector; and a resistor that is coupled between the emitter of the third NPN transistor and ground, wherein the resistor has a value that is sufficiently large such that current from the third PNP transistor flows back through the third NPN transistor.

In accordance with a preferred embodiment of the present invention, the switched current source further comprises a second resistor that is coupled between the base of the first NPN transistor and the emitter of the third PNP transistor.

In accordance with a preferred embodiment of the present invention, the emitter of the third PNP transistor is coupled to the base of the second NPN transistor.

In accordance with a preferred embodiment of the present invention, the switched current source further comprises a second resistor that is coupled between the emitter of the third PNP transistor and the base of the second NPN transistor.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
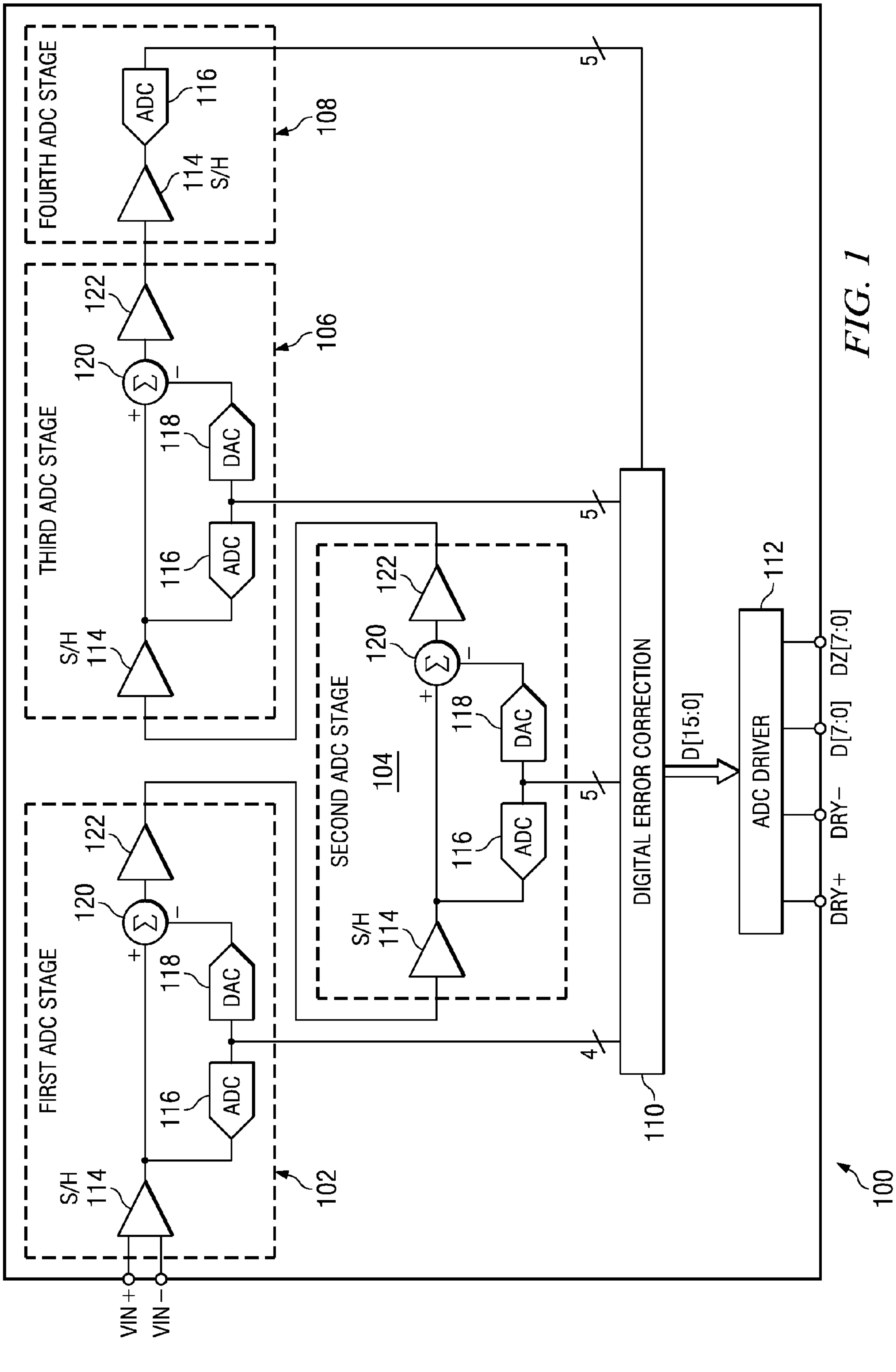
FIG. 1 is an analog-to-digital converter (ADC) in accordance with a preferred embodiment of the present invention.

Refer now to the drawings wherein depicted elements are, for the sake of clarity, not necessarily shown to scale and wherein like or similar elements are designated by the same reference numeral through the several views.

Referring to FIG. 1 of the drawings, the reference numeral 100 generally designated an ADC in accordance with a preferred embodiment of the present invention. The ADC 100 generally comprises an ADC pipeline, digital error correction circuitry 110, and an ADC output driver 112. The ADC pipeline is generally divided into a number of stages. Here, for example, four stages 102, 104, 106, and 108 are employed. As shown in FIG. 1, stages 102 through 106 are initial stages and each includes a sample-and-hold (S/H) amplifier 114, ADC 116, digital-to-analog converter (DAC) 118, summing element 120, and amplifier 122. Stage 108 is, for example, an output or final stage that includes an S/H amplifier 114 and an ADC 116.

In operation, the ADC 100 receives an analog input signal though input nodes or pins VIN+ and VIN− and outputs a digital signal across several channels (for example 16 channels). Each of stages 102 through 106 is coupled in series with one another, receiving an analog signal and outputting an analog signal. These stages 102 through 106 communicate with the digital error correction circuitry 110 so as to perform error correction. Stage 108 receives an analog signal from stage 106 and outputs a digital signal across several channels, using digital error correction circuitry 110 to perform error correction. The ADC output driver 112 receives the digital signal from the digital error correction circuitry and outputs the digital signal through a plurality of nodes or pins.

Figure 2:
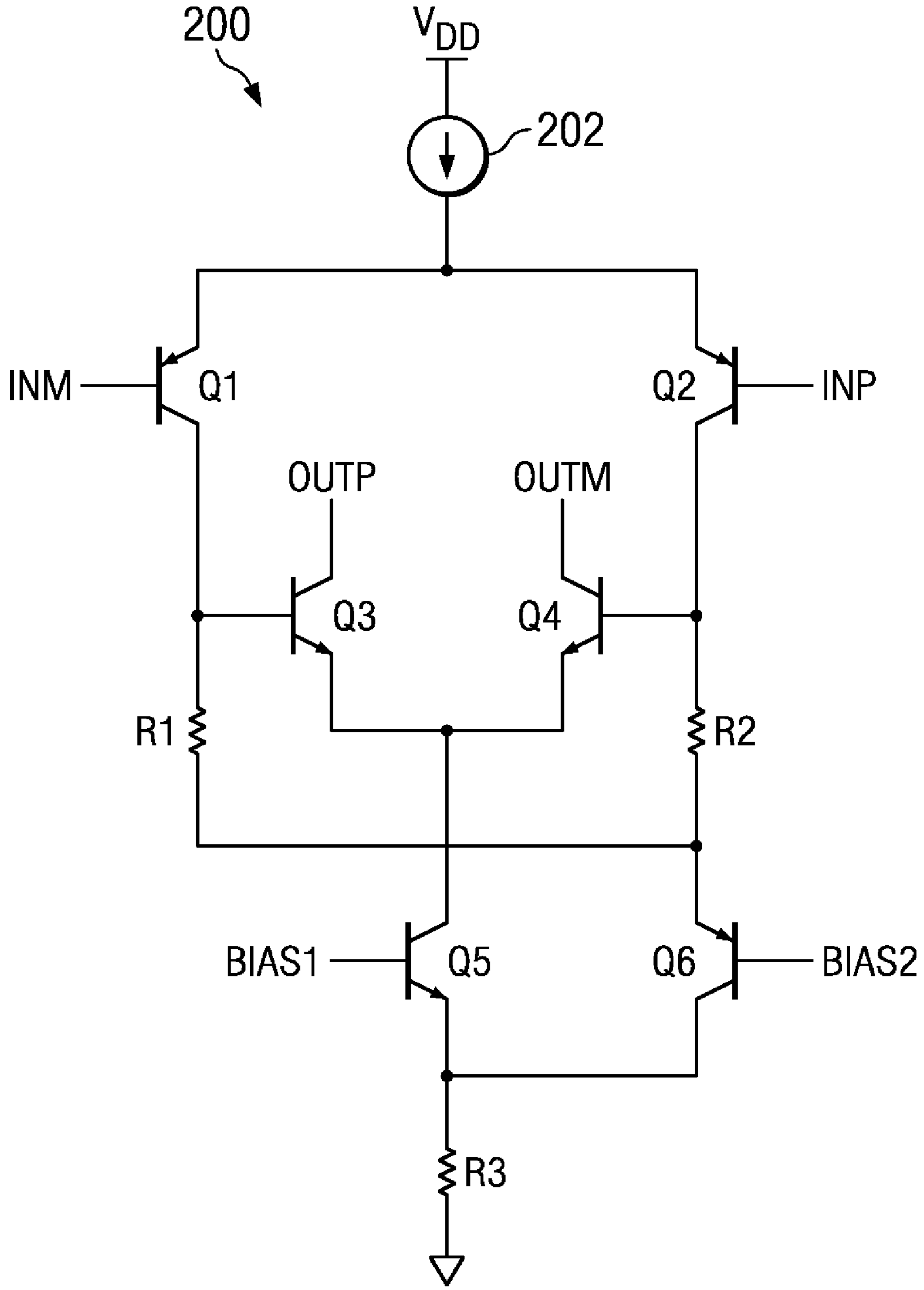
FIG. 2 is a circuit diagram depicting at least a portion of a switched current source employed in the ADC of FIG. 1.

Within DACs 118, there are several switched current sources that at least generally operate as a pre-driver circuit that drive the DAC switch inputs to the proper levels. Turning to FIG. 2, the switched current source 200 can be seen in greater details. Preferably, switched current source 200 integrates the DAC pre-driver with the DAC element in a manner that senses the error currents that are generally caused by finite output impedance due to impact ionization in transistors within source 200 and subtracts this error current from the DAC current itself, which generally results in a DAC output current that is first-order independent of the output voltage.

To accomplish this, switched current source 200 is generally comprised of current source 202, transistor Q1 through Q6, and resistors R1 through R3. In operation, input transistors Q1 and Q2 (which are preferably PNP transistors) receive input voltages INM and INP through their control electrodes or bases and are coupled to current source 202 at their respective passive electrode or emitters. Each of output transistors Q3 and Q4 (which are preferably NPN transistors) sink or source current from their passive electrodes or collectors to generate the output voltages OUTP and OUTM. These output transistors Q3 and Q4 are coupled at their control electrodes or bases to passive electrodes or collectors of input transistors Q1 and Q2. Coupled to passive electrodes or emitters of transistors Q3 and Q4 is a bias transistor Q5 (which is preferably an NPN transistor) that receives a bias voltage BIAS1 at its control electrode or base. Each of the control electrodes or bases of transistors Q3 and Q4 is also coupled to a passive electrode or emitter of error correction transistor Q6, which is preferably a PNP transistor and which receives a bias voltage BIAS2 at its control electrode or base and is coupled to the emitter or passive electrode of transistor Q5. Additionally, resistors R1 and R2 (which preferably are each about 4 kΩ are coupled between transistors Q3 and Q4 and transistor Q6, respectively. Moreover, resistor R3 (which is preferably 750Ω, respectively) coupled between a passive electrode or emitter of transistor Q5 and ground.

With switched current sources (such as switched current source 200), it is oftentimes desirable to have a high output impedance (for example 1 MΩ) to limit changes in an output current. However, with high speed applications, impact ionization as well as other factors can affect the output impedance of switched current sources (such as switched current source 200). In particular, each of transistors Q3 and Q4 has a β or current gain that can generate an error in the output currents OUTM and/or OUTP and is often difficult to account for. With switched current source 200, though, error correction transistor Q6 and resistors R3 can cooperate to correct errors that result from the current gains of transistors Q3 and Q4.

Generally, this error correction is accomplished by having transistor Q6 and resistor R3 feed a correction current or error to bias transistor Q5. By virtue of transistor Q6 being coupled to the control electrodes or bases of transistors Q3 and Q4, transistor Q6 can receive the error from transistors Q3 and Q4. This current (that generally contains the error) is able to flow back up through bias transistor Q5 to make the corrections, but to do this, resistor R3 should be sufficiently large (such as about 750Ω). Generally, the value of resistor R3 is selected to have a voltage drop across resistor R3 that is greater than the base-emitter voltage (kT/q ln $I_C$) for a selected collector current $I_C$. For example, for ADC applications, the voltage drop across resistor R3 can be one the order of 500 mV. Additionally, it may be possible to couple the passive electrode or collector of transistor Q6 to the passive electrode or collector Q5. However, this particular arrangement may introduce further errors from the switching of transistor Q5.

By having this arrangement employing error correction transistor Q6 and resistor R3, a tenfold improvement in the performance, namely output impedance, can be observed, which can dramatically increase the operational linearity or accuracy of an ADC, such as ADC 100.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:

a current source;

an input circuit that is coupled to the current source and that is adapted to receive a differential input signal;

an output circuit that is coupled to the input circuit and that is adapted to generate a differential output current based at least in part on the differential input signal;

a bias transistor that is coupled to the output circuit;

a resistor that is coupled to the bias transistor;

an error correction transistor that is coupled to input circuit and the resistor so as to feed a correction current to the bias transistor; and a resistor network that is coupled between the output circuit and the error correction transistor.

2. The apparatus of claim 1, wherein the input circuit further comprises a differential input pair of transistors.

3. The apparatus of claim 1, wherein the output circuit further comprises a differential output pair of transistors.

4. An apparatus comprising a digital-to-analog converter (DAC) having a plurality of switched current sources, wherein each switched current source includes:

a current source;

an input circuit that is coupled to the current source and that is adapted to receive a differential input signal;

an output circuit that is coupled to the input circuit and that is adapted to generate a differential output current based at least in part on the differential input signal;

a bias transistor that is coupled to the output circuit;

a resistor that is coupled to the bias transistor;

an error correction transistor that is coupled to input circuit and the resistor so as to feed a correction current to the bias transistor; and a resistor network that is coupled between the output circuit and the error correction transistor.

5. The apparatus of claim 4, wherein the input circuit further comprises a differential pair of transistors.

6. The apparatus of claim 4, wherein the output circuit further comprises a differential pair of transistors.

7. An apparatus comprising a pipelined analog-to-digital converter (ADC) having:

a plurality of stages that are coupled in series with one another, wherein each stage includes a DAC having a plurality of switched current sources, wherein each switched current source includes:

a current source;

an input circuit that is coupled to the current source and that is adapted to receive a differential input signal;

an output circuit that is coupled to the input circuit and that is adapted to generate a differential output current based at least in part on the differential input signal;

a bias transistor that is coupled to the output circuit;

a resistor that is coupled to the bias transistor;

an error correction transistor that is coupled to input circuit and the resistor so as to feed a correction current to the bias transistor; and a resistor network that is coupled between the output circuit and the error correction transistor.

8. The apparatus of claim 7, wherein the input circuit further comprises a differential pair of transistors.

9. The apparatus of claim 7, wherein the output circuit further comprises a differential pair of transistors.

10. The apparatus of claim 7, wherein each stage further comprises:

a sub-ADC that is coupled to the DAC;

a summing element that is coupled to the DAC; and a reside amplifier that is coupled to the summing element.

11. The apparatus of claim 10, wherein the ADC further comprises:

a sample-and-hold (S/H) circuit that is coupled to at least one of the stages; and a digital output circuit that is coupled to each stage.

* * * * *